(12) United States Patent
Kulkarni et al.

(10) Patent No.: US 11,822,814 B2
(45) Date of Patent: Nov. 21, 2023

(54) DYNAMIC XOR BIN MAPPING IN MEMORY DEVICES

(71) Applicant: Western Digital Technologies, Inc., San Jose, CA (US)

(72) Inventors: Shrinidhi Srikanth Kulkarni, Karnataka (IN); Vinayak Bhat, Karnataka (IN)

(73) Assignee: Western Digital Technologies, Inc., San Jose, CA (US)

( * ) Notice: Subject to any disclaimer, the term of this patent is extended or adjusted under 35 U.S.C. 154(b) by 165 days.

(21) Appl. No.: 17/682,640

(22) Filed: Feb. 28, 2022

(65) Prior Publication Data

US 2023/0273745 A1 Aug. 31, 2023

(51) Int. Cl.
*G06F 3/06* (2006.01)
*G11B 20/18* (2006.01)

(52) U.S. Cl.
CPC .......... *G06F 3/0655* (2013.01); *G06F 3/0604* (2013.01); *G06F 3/0679* (2013.01); *G11B 20/1883* (2013.01)

(58) Field of Classification Search
CPC .... G06F 3/0655; G06F 3/0604; G06F 3/0679; G06F 3/0688; G06F 11/1044; G06F 11/1096; G11B 20/1883; G11B 2020/185
See application file for complete search history.

(56) References Cited

U.S. PATENT DOCUMENTS

| 10,915,394 | B1 * | 2/2021 | Shappir | G06F 11/1451 |
| 2015/0347228 | A1 * | 12/2015 | Yang | G06F 11/1068 714/704 |
| 2016/0364181 | A1 * | 12/2016 | McGlaughlin | G06F 3/0629 |

FOREIGN PATENT DOCUMENTS

| JP | H01102795 | * | 4/1989 | |
| KR | 20170019330 A | * | 2/2017 | H03M 13/03 |

OTHER PUBLICATIONS

English Translation of JPH01102795. (Year: 1989).*
English Translation of KR20170019330A. (Year: 2017).*

* cited by examiner

*Primary Examiner* — Charles Rones
*Assistant Examiner* — Hewy H Li
(74) *Attorney, Agent, or Firm* — Armstrong Teasdale LLP

(57) ABSTRACT

A storage device includes multiple memory dies and a controller configured to: (i) perform XOR parity computations for parity bins based, at least in part, on updated contents of a first user data memory cell and contents of each user data memory cell also assigned to the first parity bin, (ii) storing the first parity data into a first parity memory cell associated with the first parity bin; (iii) identify a second parity memory cell for dynamic reconfiguration based, at least in part, on performance data of the non-volatile memory device, the second parity memory cell being assigned to a second parity bin; (iv) copy the second parity memory cell to a third memory cell of the plurality of memory cells; and (v) associate the third memory cell with the second parity bin, thereby making the third memory cell a parity memory cell of the plurality of parity memory cells.

20 Claims, 12 Drawing Sheets

FIG. 5

| WL | STR | PG# | FIM 0 DIE 0 | | | | FIM 1 DIE 0 | | | | FIM 2 DIE 0 | | | | FIM 3 DIE 0 | | | |
|---|---|---|---|---|---|---|---|---|---|---|---|---|---|---|---|---|---|---|
| | | | PL0 | PL1 | PL2 | PL3 | PL0 | PL1 | PL2 | PL3 | PL0 | PL1 | PL2 | PL3 | PL0 | PL1 | PL2 | PL3 |
| ... | | | | | | | | | | | | | | | | | | |
| 160 | 0 | 800 | 0 | 3 | 6 | 9 | 2 | 5 | 8 | 1 | 4 | 7 | 0 | 3 | 6 | 9 | 2 | 5 |
| 160 | 1 | 801 | 1 | 4 | 7 | 0 | 3 | 6 | 9 | 2 | 5 | 8 | 1 | 4 | 7 | 0 | 3 | 6 |
| 160 | 2 | 802 | 2 | 5 | 8 | 1 | 4 | 7 | 0 | 3 | 6 | 9 | 2 | 5 | 8 | 1 | 4 | 7 |
| 160 | 3 | 803 | 3 | 6 | 9 | 2 | 5 | 8 | 1 | 4 | 7 | 0 | 3 | 6 | 9 | 2 | 5 | 8 |
| 160 | 4 | 804 | 4 | 7 | 0 | 3 | 6 | 9 | 2 | 5 | 8 | 1 | 4 | 7 | 0 | 3 | 6 | 9 |
| 161 | 0 | 805 | 5 | 9 | 1 | 4 | 7 | 0 | 3 | 6 | 9 | 2 | 5 | 8 | 1 | 4 | 7 | 0 |
| 161 | 1 | 806 | 6 | 4 | 2 | 5 | 8 | 1 | 4 | 7 | 0 | 3 | 6 | 9 | 2 | 5 | 8 | 1 |
| 161 | 2 | 807 | 7 | 0 | 3 | 6 | 9 | 2 | 5 | 8 | 1 | 4 | 7 | 0 | 3 | 6 | 9 | 2 |
| 161 | 3 | 808 | 8 | 1 | 4 | 7 | 0 | 3 | 6 | 9 | 2 | 5 | 8 | 1 | 4 | 7 | 0 | 3 |
| 161 | 4 | 809 | PAD | PAD | PAD | PAD | PAD | P7 | P0 | P3 | P6 | P9 | P2 | P5 | P8 | P1 | P4 |

| WL | STR | PG# | FIM 0 DIE 0 | | | | FIM 1 DIE 0 | | | | FIM 2 DIE 0 | | | | FIM 3 DIE 0 | | | |
|---|---|---|---|---|---|---|---|---|---|---|---|---|---|---|---|---|---|---|
| | | | PL0 | PL1 | PL2 | PL3 | PL0 | PL1 | PL2 | PL3 | PL0 | PL1 | PL2 | PL3 | PL0 | PL1 | PL2 | PL3 |
| ... | ... | ... | | | | | | | | | | | | | | | | |
| 160 | 0 | 800 | 0 | 3 | 6 | 9 | 2 | 5 | | | | | | | | | | |
| 160 | 1 | 801 | 1 | 4 | 7 | 0 | 3 | 6 | | | | | | | | | | |
| 160 | 2 | 802 | 2 | 5 | 8 | 1 | 4 | 7 | | | | | | | | | | |
| 160 | 3 | 803 | 3 | 6 | 9 | 2 | 5 | 8 | | | | | | | | | | |
| 160 | 4 | 804 | 4 | 7 | 0 | 3 | 6 | 9 | | | | | | | | | | |
| 161 | 0 | 805 | 5 | 9 | 1 | 4 | 7 | 0 | | | | | | | | | | |
| 161 | 1 | 806 | 6 | 4 | 2 | 5 | 8 | 1 | | | | | | | | | | |
| 161 | 2 | 807 | 7 | 0 | 3 | 6 | 9 | 2 | | | | | | | | | | |
| 161 | 3 | 808 | 8 | 1 | 4 | 7 | 0 | 3 | | | | | | | | | | |
| 161 | 4 | 809 | 9 | 2 | 5 | 8 | 1 | 4 | P7 | P0 | P3 | P6 | P9 | P2 | P5 | P8 | P1 | P4 |

DYNAMIC XOR BIN MAPPING IN MEMORY DEVICES

BACKGROUND

Semiconductor memory is widely used in various electronic devices such as cellular telephones, digital cameras, personal digital assistants, medical electronics, mobile computing devices, and non-mobile computing devices. Semiconductor memory may include non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure (e.g., 3D NAND). One example of a 3D memory structure is the Bit Cost Scalable (BiCS) architecture which includes a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

Such memory can exhibit errors during operation, such as errors in properly storing or reading data values from individual of the memory cells. Some common errors include memory wear, word line to word line shorts (WL-WL shorts) across neighboring planes (also referred to herein as "neighbor plane disturb" errors), read disturb errors, program disturb errors, and retention errors, to name but a few. Various techniques for detecting and correcting transient or permanent errors have been developed, such as use of error correction codes (ECC) (e.g., Reed-Solomon ECC, Hamming codes, Bose-Chaudhuri-Hocqeunghem (BCH) codes, low-density parity check (LDPC) codes, and the like. However, such error correction can incur additional computational overhead. What is needed are flash memory devices that use dynamic exclusive-OR (XOR) parity data to limit the need for the additional computational overhead by, for example, relocating parity data away from excessively erroring components or replicating parity data for the excessively erroring components.

SUMMARY

The present application describes a method that includes identifying a plurality of parity bins associated with a non-volatile memory device, the non-volatile memory device including a plurality of memory cells. The method also includes assigning a first subset of memory cells from the plurality of memory cells to store user data, thereby defining a plurality of user data memory cells and a remainder subset of memory cells. The method further includes assigning one memory cell from the remainder subset of memory cells to each parity bin of the plurality of parity bins, thereby defining a plurality of parity memory cells configured to store parity data. The method also includes assigning each user data memory cell of the plurality of user data memory cells to one of the parity bins of the plurality of parity bins. The method further includes performing exclusive-OR (XOR) parity computations during a write operation to a first user data memory cell that is assigned to a first parity bin, the XOR parity computations generating first parity data based, at least in part, on updated contents of the first user data memory cell and contents of each user data memory cell also assigned to the first parity bin, the XOR parity computations including storing the first parity data into a first parity memory cell associated with the first parity bin. The method also includes identifying a second parity memory cell for dynamic reconfiguration based, at least in part, on performance data of the non-volatile memory device, the second parity memory cell being assigned to a second parity bin. The method further includes copying the second parity memory cell to a third memory cell of the plurality of memory cells. The method also includes associating the third memory cell with the second parity bin, thereby making the third memory cell a parity memory cell of the plurality of parity memory cells.

The present application also describes a storage device that includes a non-volatile storage device. The non-volatile storage device includes a plurality of memory dies, the non-volatile memory device including a plurality of memory cells. The storage device also includes a controller communicatively coupled to the non-volatile storage device and configured to: (i) identify a plurality of parity bins associated with a non-volatile memory device; (ii) assign a first subset of memory cells from the plurality of memory cells to store user data, thereby defining a plurality of user data memory cells and a remainder subset of memory cells; (iii) assign one memory cell from the remainder subset of memory cells to each parity bin of the plurality of parity bins, thereby defining a plurality of parity memory cells configured to store parity data; (iv) assign each user data memory cell of the plurality of user data memory cells to one of the parity bins of the plurality of parity bins; (v) perform exclusive-OR (XOR) parity computations during a write operation to a first user data memory cell that is assigned to a first parity bin, the XOR parity computations generating first parity data based, at least in part, on updated contents of the first user data memory cell and contents of each user data memory cell also assigned to the first parity bin, the XOR parity computations including storing the first parity data into a first parity memory cell associated with the first parity bin; (vi) identify a second parity memory cell for dynamic reconfiguration based, at least in part, on performance data of the non-volatile memory device, the second parity memory cell being assigned to a second parity bin; (vii) copy the second parity memory cell to a third memory cell of the plurality of memory cells; and (viii) associate the third memory cell with the second parity bin, thereby making the third memory cell a parity memory cell of the plurality of parity memory cells.

Also described is a storage device that includes a non-volatile storage device comprising a plurality of memory dies, where the non-volatile memory device including a plurality of memory cells. The storage device also includes means for performing exclusive-OR (XOR) parity computations on the non-volatile memory device between a plurality of user data memory cells and a plurality of parity memory cells based, at least in part, on assignment of one parity bin of a plurality of parity bins to each memory cell of the plurality of user data memory cells and the plurality of parity memory cells. The storage device further includes means for identifying a first parity memory cell for dynamic reconfiguration based, at least in part, on performance data of the non-volatile memory device, the first parity memory cell being assigned to a first parity bin. The storage device also includes means for copying the first parity memory cell to a second memory cell of the plurality of memory cells.

The storage device further includes means for associating the second memory cell with the first parity bin, thereby making the second memory cell a parity memory cell of the plurality of parity memory cells.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 5 is a diagram of another parity table that illustrates parity protection on a memory device such as the 3D memory structure of the non-volatile memory shown in FIGS. 1-3

FIGS. 7A-7C show an example parity table illustrating stages of dynamic parity reconfiguration that includes moving one or more parity cells.

FIGS. 8A and 8B show an example parity table illustrating stages of reconfiguration during dynamic parity reconfiguration that includes duplicating one or more parity cells.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

Certain configurations of XOR parity can introduce higher reliance on certain dies storing the parity information. The various dies making up a memory system can exhibit differing errors or error rates based on, for example, defects in wafer manufacturing, sources of memory dies, or the like. Some error conditions may be present early in the life of a memory device (e.g., at "T0," immediately after manufacture). Other error conditions may arise during the lifetime of the memory device. When parity is statically defined, the parity memory cells may be fixed to a particular memory region that is subject to more errors than other memory cells of the memory device. Further, some parity memory configurations may result in padding areas that are wasted space within the memory.

In order to address the above problems, the present application describes a system and method to overcome problems with static XOR parity placement. For example, in one embodiment, a memory controller is configured to perform dynamic reconfiguration of parity memory cells when an excess number of errors has occurred on a subcomponent of memory. The memory controller may relocate parity memory cells to avoid certain memory cells that are exhibiting excessive errors. In another embodiment, the memory controller is configured to duplicate (e.g., mirror) parity memory cells that appear to be subject to excessive errors.

Dynamic reconfiguration of parity memory cells provides numerous benefits. For example, at drive build time, padding areas can be stored in such a way that whichever memory dies have the least number of errors (e.g., FBBs) stores the XOR parity data. The parity configuration can be updated to favor the best dies (e.g., FBB+GBB). Dynamic reconfiguration of parity memory cells can reduce the dependency on select dies that store parity information (e.g., leaning away from the memory dies that are prone to more defects). Further, a flexible, redundant parity scheme provides better protection and changes with the conditions of the memory.

These various benefits and examples will be described in greater detail below with reference to FIG. 1-FIG. 9B.

Figure 1:
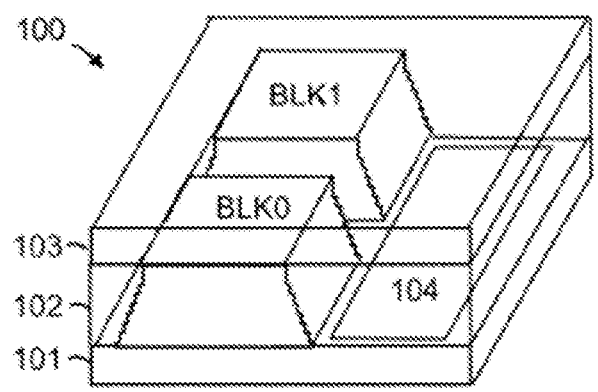
FIG. 1 is a perspective view of a storage system that includes three-dimensional (3D) stacked non-volatile memory.
Figure 2:
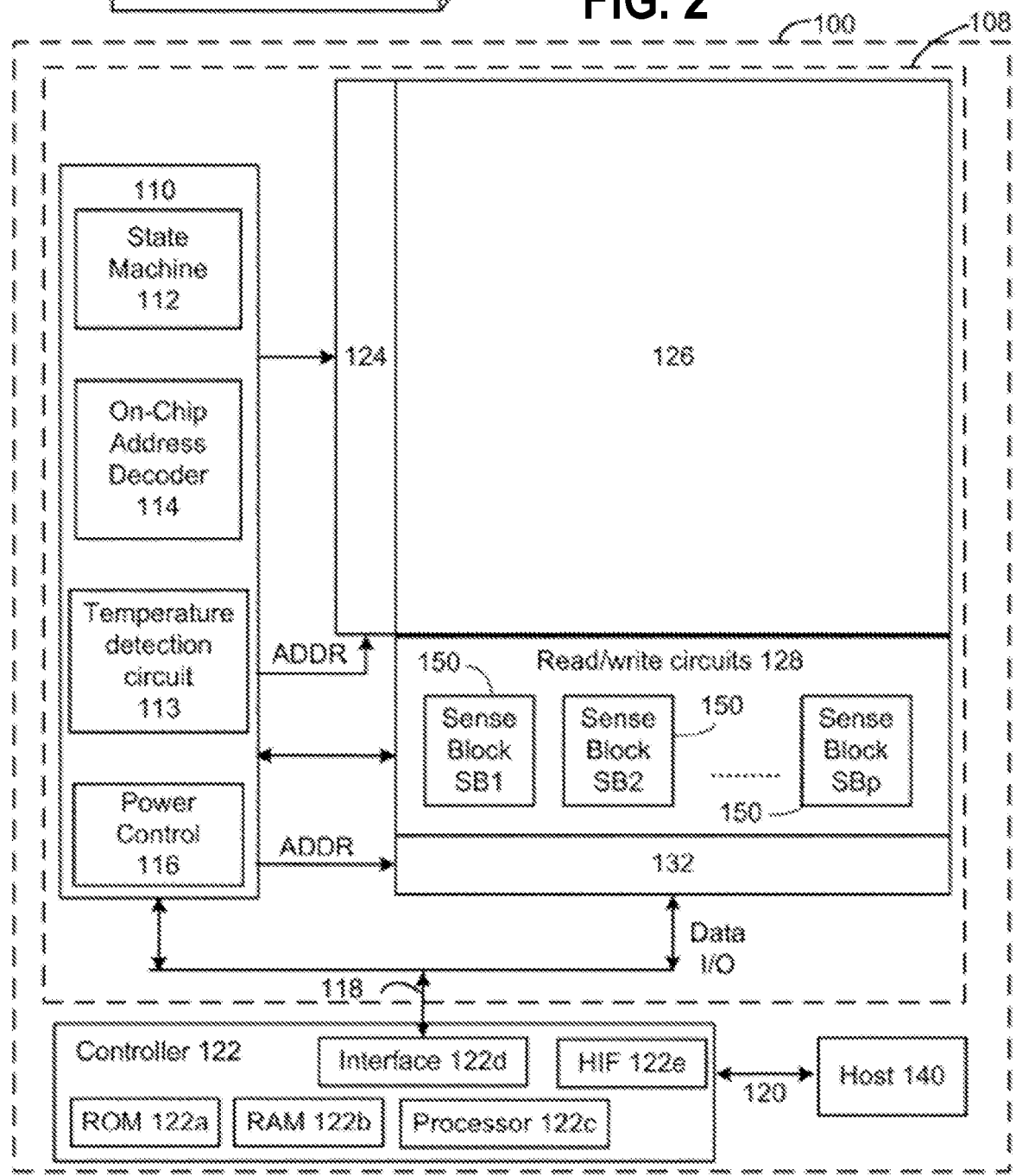
FIG. 2 is a functional block diagram of an example storage device, such as the 3D stacked non-volatile storage device of FIG. 1.
Figure 3:
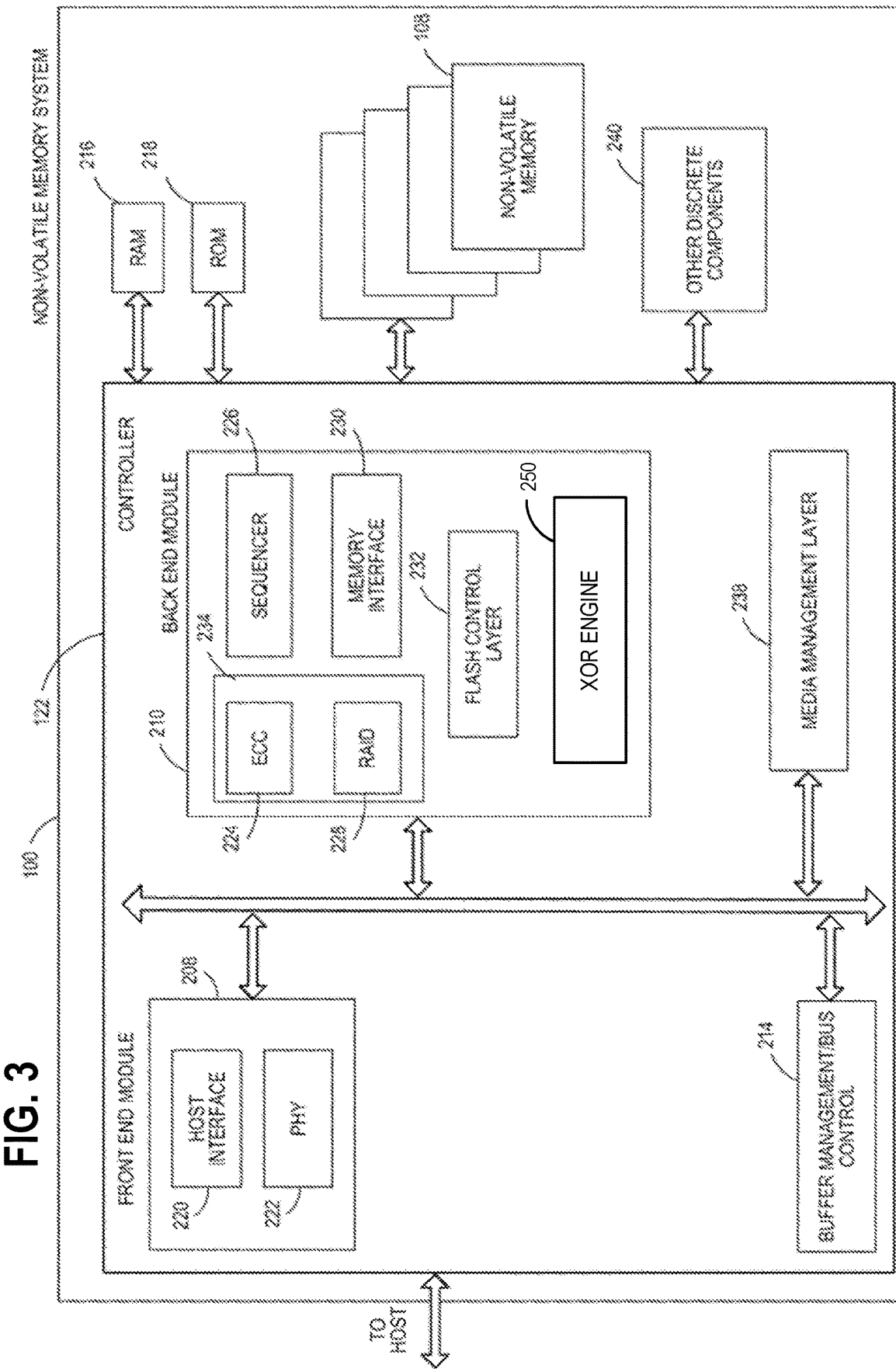
FIG. 3 is a block diagram of example storage system, depicting more details of controller.

FIGS. 1-3 describe one example of a storage system that can be used to implement the technology proposed herein. FIG. 1 is a perspective view of a storage system that includes three-dimensional (3D) stacked non-volatile memory. The storage device 100 includes a substrate 101. On and above the substrate are example blocks of memory cells, including BLK0 and BLK1, formed of memory cells (non-volatile memory elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the storage device 100. In an upper region 103 of the storage device 100, one or more upper metal layers are patterned in conductive paths to carry signals of the circuits. Each block of memory cells includes a stacked area of memory cells, where alternating levels of the stack represent word lines. While two blocks are depicted as an example, additional blocks can be used, extending in the x- and/or y-directions.

In one example implementation, the length of the plane in the x-direction represents a direction in which signal paths for word lines extend (e.g., a word line or drain-end select gate (SGD) line direction) and the width of the plane in the y-direction represents a direction in which signal paths for bit lines extend (e.g., a bit line direction). The z-direction represents a height of the storage device 100.

FIG. 2 is a functional block diagram of an example storage device, such as the 3D stacked non-volatile storage device 100 of FIG. 1. The components depicted in FIG. 2 are electrical circuits. Storage device 100 includes one or more memory dies 108. Each memory die 108 includes a three-dimensional memory structure 126 of memory cells (e.g., a 3D array of memory cells), control circuitry 110, and read/write circuits 128. In other embodiments, a two-dimensional array of memory cells can be used. Memory structure 126 is addressable by word lines via a decoder 124 (e.g., row decoder) and by bit lines via a column decoder 132. The read/write circuits 128 include multiple sense blocks 150 including SB1, SB2, . . . , SBp (e.g., sensing circuitry) and allow a page of memory cells to be read or programmed in parallel. In some systems, a controller 122 is included in the same storage device 100 (e.g., a removable storage card) as the one or more memory dies 108. However, in other systems, the controller can be separated from the memory die 108. In some embodiments, the controller may be on a different die than the memory die. In some embodiments, one controller 122 may communicate with multiple memory dies 108. In other embodiments, each memory die 108 has its own controller. Commands and data are transferred between the host 140 and controller 122 via a data bus 120, and between controller 122 and one or more of the memory dies 108 via lines 118. In one embodiment, memory die 108 includes a set of input and/or output (I/O) pins that connect to lines 118.

Memory structure 126 may include one or more arrays of memory cells, including a 3D array. The memory structure may include a monolithic 3D memory structure in which multiple memory levels are formed above (e.g., and not in) a single substrate, such as a wafer, with no intervening substrates. The memory structure may include any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses, and other devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers in a 3D configuration, select transistors (e.g., SGS and SGD transistors) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and controller 122 can be considered one or more control circuits, or a managing circuit, that performs some or all of the functions described herein.

Controller 122, which in one embodiment is an electrical circuit that may be on-chip or off-chip, may include one or more processors 122*c*, ROM 122*a*, RAM 122*b*, memory interface 122*d*, and host interface 122*e*, all of which are interconnected. One or more processors 122*c* is one example of a control circuit. Other embodiments can use state machines or other custom circuits designed to perform one or more functions. Devices such as ROM 122*a* and RAM 122*b* may include code such as a set of instructions, and the processor 122*c* may be operable to execute the set of instructions to provide some or all of the functionality described herein. Alternatively or additionally, processor 122*c* may access code from a memory device in the memory structure, such as a reserved area of memory cells connected to one or more word lines. Memory interface 122*d*, in communication with ROM 122*a*, RAM 122*b*, and processor 122*c*, is an electrical circuit that provides an electrical interface between controller 122 and memory die 108. For example, memory interface 122*d* can change the format or timing of signals, provide a buffer, isolate from surges, latch I/O, and so forth. Processor 122*c* may issues commands to control circuitry 110, or any other component of memory die 108, via memory interface 122*d*. Host interface 122*e*, in communication with ROM 122*a*, RAM 122*b*, and processor 122*c*, is an electrical circuit that provides an electrical interface between controller 122 and host 140. For example, host interface 122*e* can change the format or timing of signals, provide a buffer, isolate from surges, latch I/O, and so forth. Commands and data from host 140 are received by controller 122 via host interface 122*e*. Data sent to host 140 are transmitted via host interface 122*e*.

Multiple memory elements in memory structure 126 may be configured so that they are connected in series or so that each element is individually accessible. By way of non-limiting example, flash memory devices in a NAND configuration (e.g., NAND flash memory) typically contain memory elements connected in series. A NAND string is an example of a set of series-connected memory cells and select gate transistors.

A NAND flash memory array may be configured so that the array includes multiple NAND strings, where a NAND string includes multiple memory cells sharing a single bit line and that are accessed as a group. Alternatively, memory elements may be configured so that each element is individually accessible (e.g., a NOR memory array). NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

Some three-dimensional memory arrays are arranged so that memory cells occupy multiple planes or multiple memory device levels, thereby forming a structure in three dimensions (e.g., in the x, y, and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

By way of non-limiting example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of example storage system 100, depicting more details of controller 122. In one embodiment, the system of FIG. 3 is a solid-state drive (SSD). As used herein, a flash memory controller is a device that manages data stored on flash memory and communicates with a host, such as a computer or other electronic device. A flash memory controller may have various functionalities in addition to the specific functionalities described herein. For example, the flash memory controller may format the flash memory to ensure the memory is operating properly, map out bad flash memory cells, and allocate spare memory cells to be substituted for future failed memory cells. Some part of the spare memory cells can be used to hold firmware to operate the flash memory controller and implement other features. During operation, when a host reads data from or writes data to the flash memory, the host will communicate with the flash memory controller. If the host provides a logical address to which data is to be read/written, the flash memory controller may convert the logical address received from the host to a physical address in the flash memory. Alternatively, in some embodiments, the host may provide the physical address. The flash memory controller may also perform various memory management functions such as, but not limited to, wear leveling (e.g., distributing writes to avoid wearing out specific blocks of memory that may otherwise be repeatedly written to) and garbage collection (e.g., after a block is full, moving only the valid pages of data to a new block, so the full block can be erased and reused). Non-volatile memories other than flash may have non-volatile memory controllers that are similar to flash memory controllers.

The communications interface between controller 122 and non-volatile memory dies 108 may be any suitable flash interface, such as toggle mode. In one embodiment, storage subsystem 100 may be a card based system, such as a secure digital (SD) or a micro secure digital (micro-SD) card. In another embodiment, storage system 100 may be part of an embedded storage system. For example, the flash memory may be embedded within the host, such as in the form of a solid-state disk drive installed in a personal computer.

In some embodiments, storage system 100 includes a single channel between controller 122 and non-volatile memory dies 108. However, the subject matter described herein is not limited to having a single memory channel. For example, in some storage system architectures, two, four, eight, or more channels may exist between the controller and the memory dies 108 (e.g., depending on controller capabilities). In any of the embodiments described herein, more than a single channel may exist between the controller and the memory dies 108, even if a single channel is shown in the drawings.

As depicted in FIG. 3, controller 122 includes a front-end module 208 that interfaces with a host, a back-end module 210 that interfaces with the one or more non-volatile memory dies 108, and various other modules that perform functions which are described herein.

The components of controller 122 depicted in FIG. 3 may take the form of a packaged functional hardware unit (e.g., an electrical circuit) designed for use with other components, a portion of a program code (e.g., software or firmware) executable by a processor or processing circuitry (e.g., one or more processors) that usually performs a particular function or related functions, or a self-contained hardware or software component that interfaces with a larger system. For example, each module may include an application-specific integrated circuit (ASIC), a field programmable gate array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program one or more processors for controller 122 to perform the functions described herein. The architecture depicted in FIG. 3 is one example implementation that may or may not use the components of controller 122 depicted in FIG. 2 (e.g., RAM, ROM, processor, interface).

Referring again to modules of the controller 122, a buffer manager/bus controller 214 manages buffers in random access memory (RAM) 216 and controls the internal bus arbitration of controller 122. A read-only memory (ROM) 218 stores system boot code. Although illustrated in FIG. 3 as located separately from the controller 122, in other embodiments, one or both of the RAM 216 and ROM 218 may be located both within the controller 122 and outside the controller 122. Further, in some implementations, the controller 122, RAM 216, and ROM 218 may be located on separate semiconductor dies.

Front-end module 208 includes a host interface 220 and a physical layer interface 222 (PHY) that provide the electrical interface with the host or next level storage controller. The choice of the type of host interface 220 can depend on the type of memory being used. Examples of host interfaces 220 include, for example, SATA, SATA Express, SAS, Fibre Channel, USB, PCIe, and NVMe. The host interface 220 may be a communication interface that facilitates transfer for data, control signals, and timing signals.

Back-end module 210 includes an error correction controller (ECC) engine 224 that encodes the data bytes received from the host and decodes and error corrects the data bytes read from the non-volatile memory. A command sequencer 226 generates command sequences, such as program and erase command sequences, to be transmitted to non-volatile memory dies 108. A RAID (redundant array of independent dies) module 228 manages generation of RAID parity and recovery of failed data. The RAID parity may be used as an additional level of integrity protection for the data being written into the storage system 100. In some cases, the RAID module 228 may be a part of the ECC engine 224. Note that the RAID parity may be added as an extra die or dies, or may be added within existing dies (e.g., as extra plane(s), extra block(s), or extra WL(s) within block(s). ECC engine 224 and RAID module 228 may calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory dies 108. In some embodiments, memory interface 230 may be a double data rate (DDR) interface. A flash control layer 232 controls the overall operation of back-end module 210.

Back-end module 210 also includes an XOR engine 250. The XOR engine 250 performs many of the various parity protection methods for managing the non-volatile memory 108 as shown and described below with respect to FIGS. 4-9B.

Additional components of storage system 100 illustrated in FIG. 3 include media management layer 238, which performs wear leveling of memory cells of non-volatile memory dies 108. Storage system 100 also includes other discrete components 240, such as external electrical interfaces, external RAM, resistors, capacitors, or other components that may interface with controller 122. In other embodiments, one or more of the physical layer interface 222, media management layer 238, and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the storage device firmware which translates writes from the host into writes to the flash memory structure 126 of memory dies 108. The MML 238 may be used because, for example, the flash memory may have limited endurance, the flash memory structure 126 may only be written in multiples of pages, or the flash memory structure 126 may not be written unless it is erased as a block (e.g., a block may be considered to be a minimum unit of erase and such a non-volatile memory may be considered a block-erasable non-volatile memory). The MML 238 is configured to operate under these potential limitations of the flash memory structure 126, which may not be visible to the host. Accordingly, the MML 238 attempts to translate the writes from host into writes into the flash memory structure 126.

Controller 122 may interface with one or more memory dies 108. In one embodiment, controller 122 and multiple memory dies 108 (e.g., together making up the storage system 100) implement an SSD, which can emulate, replace, or be used instead of a hard disk drive inside a host device, as a NAS device, or the like. Additionally, the SSD need not be made to work as a hard drive.

Figure 4:
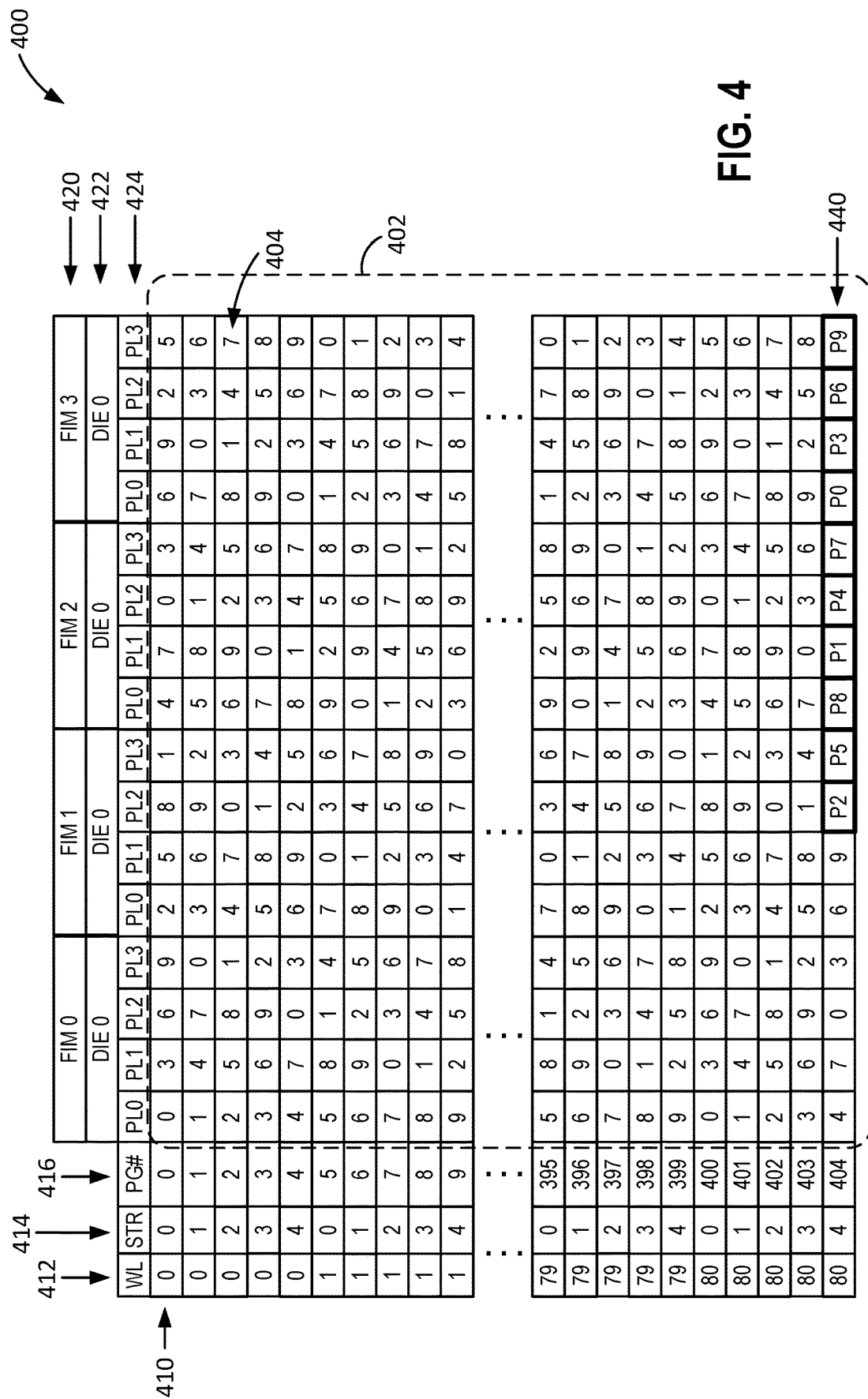
FIG. 4 is a diagram of a parity table that illustrates parity protection on a memory device such as the 3D memory structure of the non-volatile memory shown in FIGS. 1-3.

FIG. 4 is a diagram of a parity table 400 that illustrates parity protection on a memory device such as the 3D memory structure 126 of the non-volatile memory 108 shown in FIGS. 1-3. In some embodiments, the parity protection methods described herein may be performed by a memory controller, such as the memory controller 122 shown in FIG. 3 and the components therein (e.g., the XOR engine 250). In the example embodiment, the memory structure 126 is a 3D NAND-type memory device using charge trapping (e.g., charge trap flash (CTF)) that stores user data and parity data in a memory area represented in FIG. 4 as memory area 402. As described herein, the memory controller 122 uses exclusive-OR (XOR) parity techniques to protect that user data from memory errors, such as word line to word line shorts (WL-WL shorts), read disturb errors, program disturb errors, retention errors, and the like. The parity table 400 is a representation of that memory area 402 that is used herein to illustrate aspects of these XOR parity techniques.

Parity table 400 illustrates the memory managed by the memory controller 122 based on aspects of the memory configuration. In the example embodiment, the columns of the parity table 400 show multiple transfer channels (e.g., FIM 0, FIM 1, FIM 2, and FIM 3, collectively "FIMs 420"), each of which has one memory die (e.g., DIE 0, collectively "dies 422"). Each die 422 has four planes (e.g., PL0, PL1, PL2, and PL3, collectively "planes 424"). The rows 410 of the parity table 400 are organized by page numbers (PG #) 416, where each row 410 has a unique page number, starting at zero. Each row represents a particular word line (WL) 412 and string (STR) 414 included in the memory. In this example, each word line 412 has 5 strings. It should be understood that the number of FIMs 420, dies 422 per FIM 422, planes 424 per die 422, strings 414 per word line 412, and total number of word lines 412 and pages 416 used in the example embodiments shown herein, including FIGS. 4-8B, are merely representative, may vary based on different memory architectures.

In the example embodiment, each cell 404 within the parity table 400 represents a memory cell of the memory being managed by the memory controller 122. Each memory cell represents one page of data (e.g., 16 kilobytes of data, or the like). Each of the cells 404 within the memory area 402 stores either user data or parity data. More specifically, a parity area (or "redundancy area") 440 of ten individual memory cells is used for parity data, where all of the other cells 404 are used for user data.

In this parity table 400, each cell 404 that is used for user data shows a parity bin identifier (or just "parity bin"). In this example, there are ten parity bins, represented by the integers 0-9, only one of which appears in each cell 404. The parity bins represent groupings of cells that are used by the XOR parity techniques described herein. Each cell of the parity area 440 shows a parity bin identifier "PX", where the "P" is used to identify a cell as parity data and X shows with which parity bin that cell is associated. For example, parity bin 0 has numerous user data cells 404 appearing throughout the memory area 402 (e.g., with "0" showing in each of those cells 404), as well as a single "P0" parity cell showing in the parity area 440. Likewise, each of the other nine parity bins include a single parity cell (e.g., "P1" through "P9"). Each parity bin may be referred to herein as "X-bin" for purposes of convenience, where X is one of the parity bin identifiers.

During operation, the memory controller 122 performs XOR parity on the memory area 402. More specifically, in the example embodiment, the memory controller 122 groups the cells 404 based on these parity bins and performs XOR parity on those groups. For example, when a change is made to one of the 0-bin cells 404, the memory controller 122 computes a new parity value for the P0 parity cell based on the values of all of the 0-bin cells 404 (e.g., XOR-ing all of the values of the 0-bin cells together to determine a new value of the P0 parity cell, then writing that new parity data to the P0 parity cell).

Figure 5:
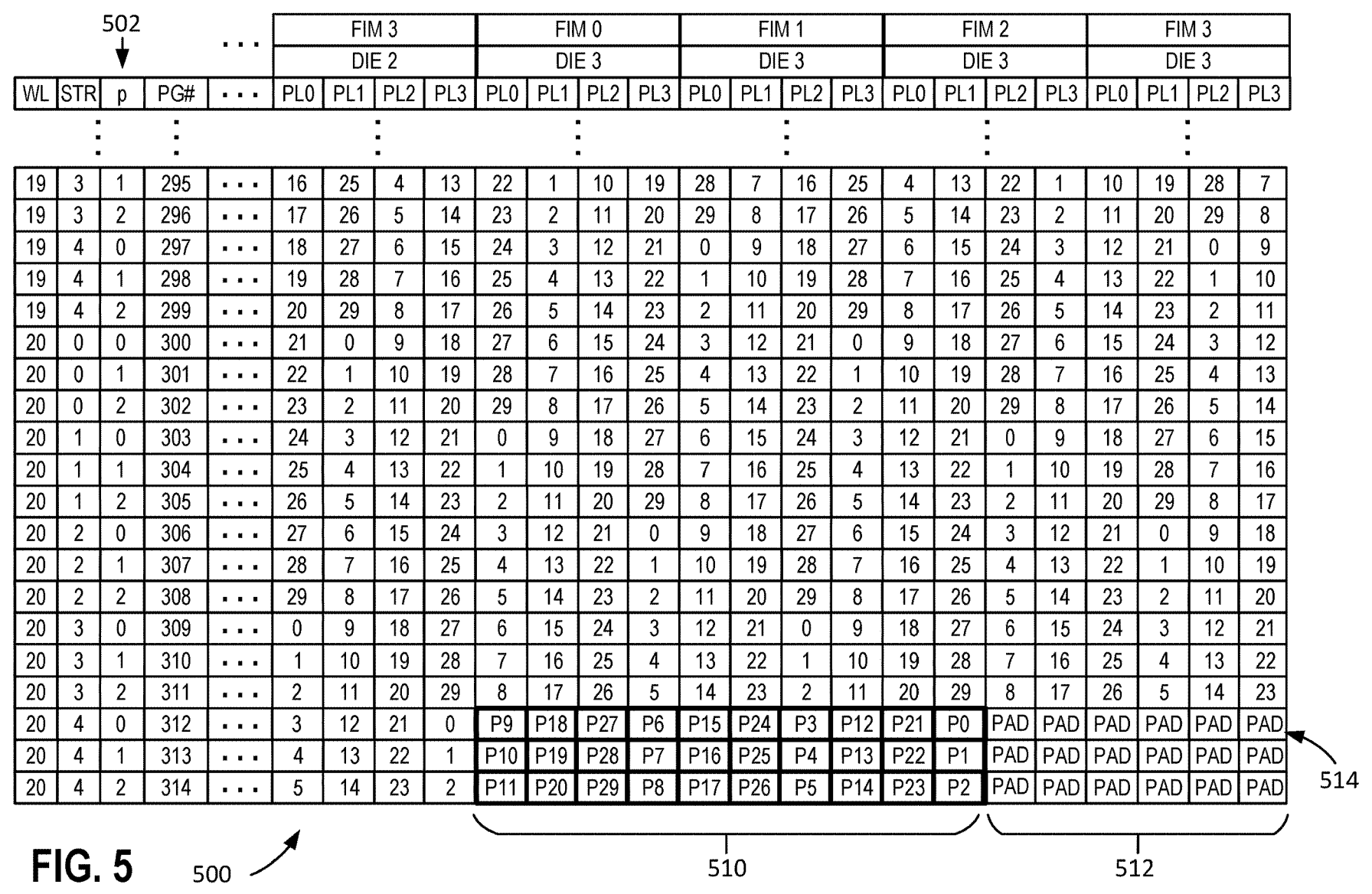

FIG. 5 is a diagram of another parity table 500 that illustrates parity protection on a memory device such as the 3D memory structure 126 of the non-volatile memory 108 shown in FIGS. 1-3. In some embodiments, the parity table 500 and associated operations may be similar to the parity table 400 and operations described with respect to FIG. 4. It should be understood that elements similar between parity table 400 and parity table 500 are not numbered in FIG. 5 for purposes of space, as the similarity to such elements is clear. Further, it should be understood that only a portion of the parity table 500 is shown in FIG. 5 to illustrate particular aspects.

In the example embodiment, the memory architecture of the memory managed by the memory controller 122 differs from that shown in FIG. 4. In this example embodiment, the parity table 500 represents multiple transfer channels (e.g., FIM 0, FIM 1, FIM 2, and FIM 3, collectively "FIMs 420"), each of which has multiple memory dies (e.g., DIE 0, DIE 1, DIE 2, DIE 3), and each die has four planes (e.g., PL0, PL1, PL2, and PL3). The rows of the parity table 500 are similarly organized by page numbers (PG #), where each row has a unique page number, starting at zero. Each row represents a particular word line (WL) and string (STR), but for each of three pages ("p") 502 included in the memory (e.g., where "p"=0, 1, or 2).

In this example, there are thirty parity bins used by the memory controller 122, represented by the integers 0-29. Further, each cell of a parity area 510 shows a parity bin identifier "PX" for each of the thirty parity bins, spread out across three pages (e.g., pages 312, 313, and 314). This example embodiment also includes several padding cells (or just "PAD cells") 514 of a padding area 512. PAD cells 514 represent unused memory cells (e.g., that contain neither user data nor parity data). As such, it should be noted that each of the PAD cells 514 are not assigned to any particular parity bin. In other words, the PAD cells 514 contain no useful data and, as such, are not included in parity protection.

The assignment of these PAD cells 514 of the padding area 512 can arise in certain scenarios, and for certain reasons. In some configurations, XOR parity may be aligned to the number of pages in a meta-page. However, there can arise other configurations that cause uneven XOR parity distribution, such as shown in FIG. 4 and FIG. 5. For example, in both FIGS. 4 and 5, the parity data (e.g., parity areas 440, 510) is disproportionately skewed to certain memory dies. Uneven parity distribution amongst the memory dies introduces a higher reliance on those memory dies storing the parity data. However, defects in manufacturing or changes to the memory over time can, and often do, result in memory dies of varying reliability. If some of the memory dies used by the parity data are less reliable than other memory dies, then the parity data stored in the PX parity cells may be subject to additional errors, and thus the performance of the memory subsystem as a whole can suffer. Further, in some configurations such as that shown in FIG. 5, the placement of parity data may result in padding of some memory cells, such as the padding area 512 (e.g., to prevent additional computational complexity in firmware, to avoid a decrease in performance, or the like).

Figure 6:
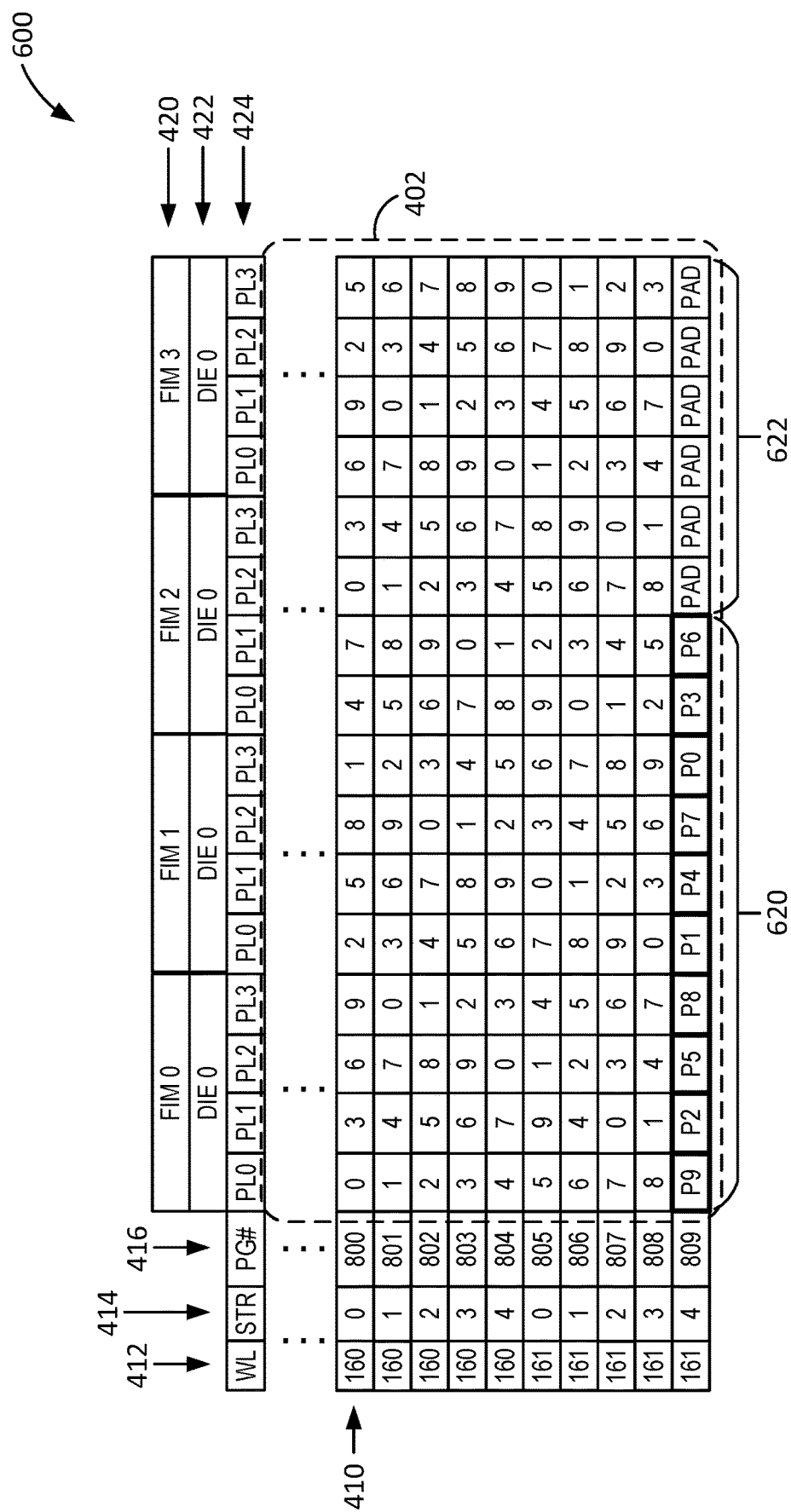
FIG. 6 provides a parity table of an example memory structure that illustrates an example initial parity bin and parity placement configuration.
Figure 7A:
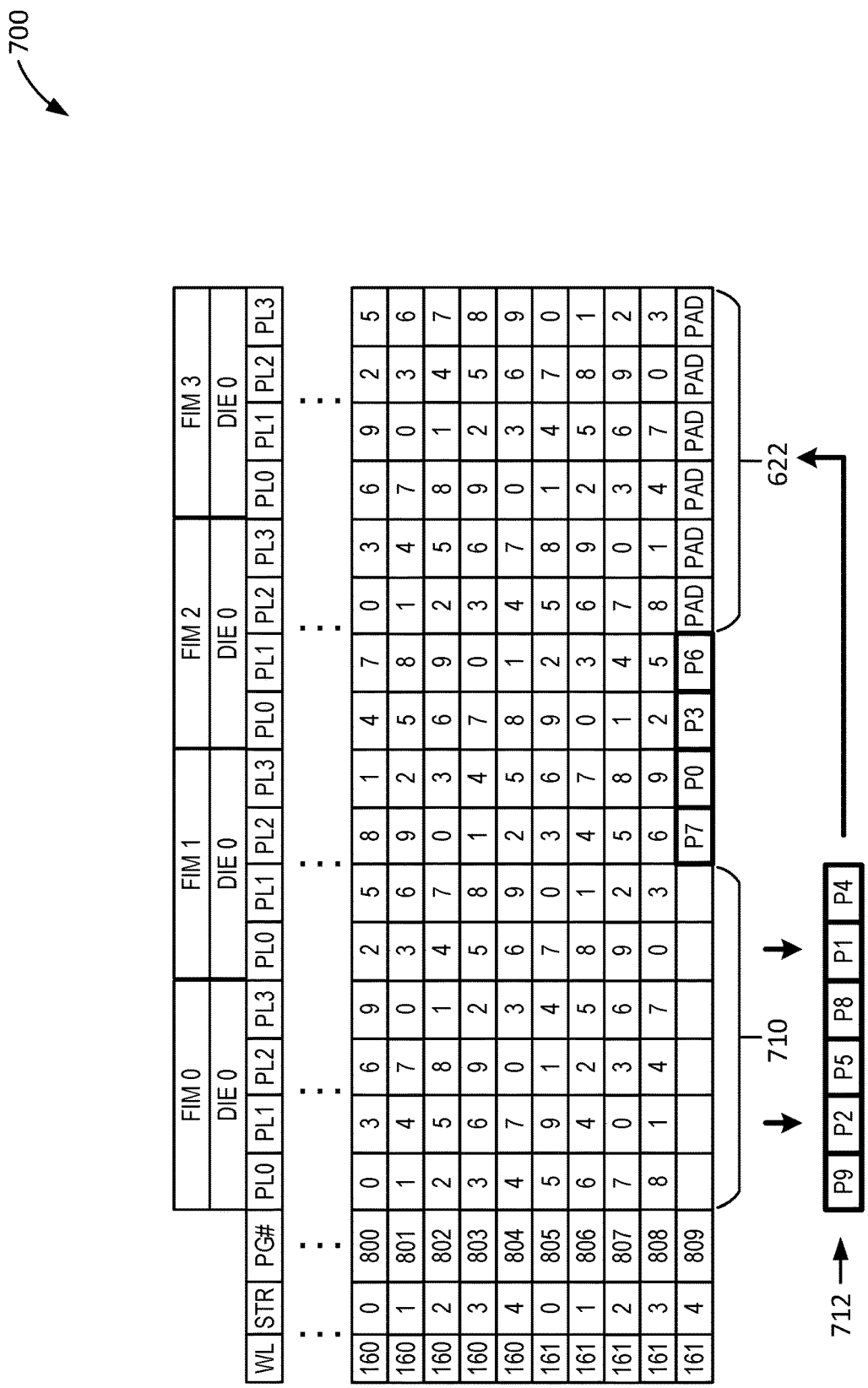
Figure 8A:
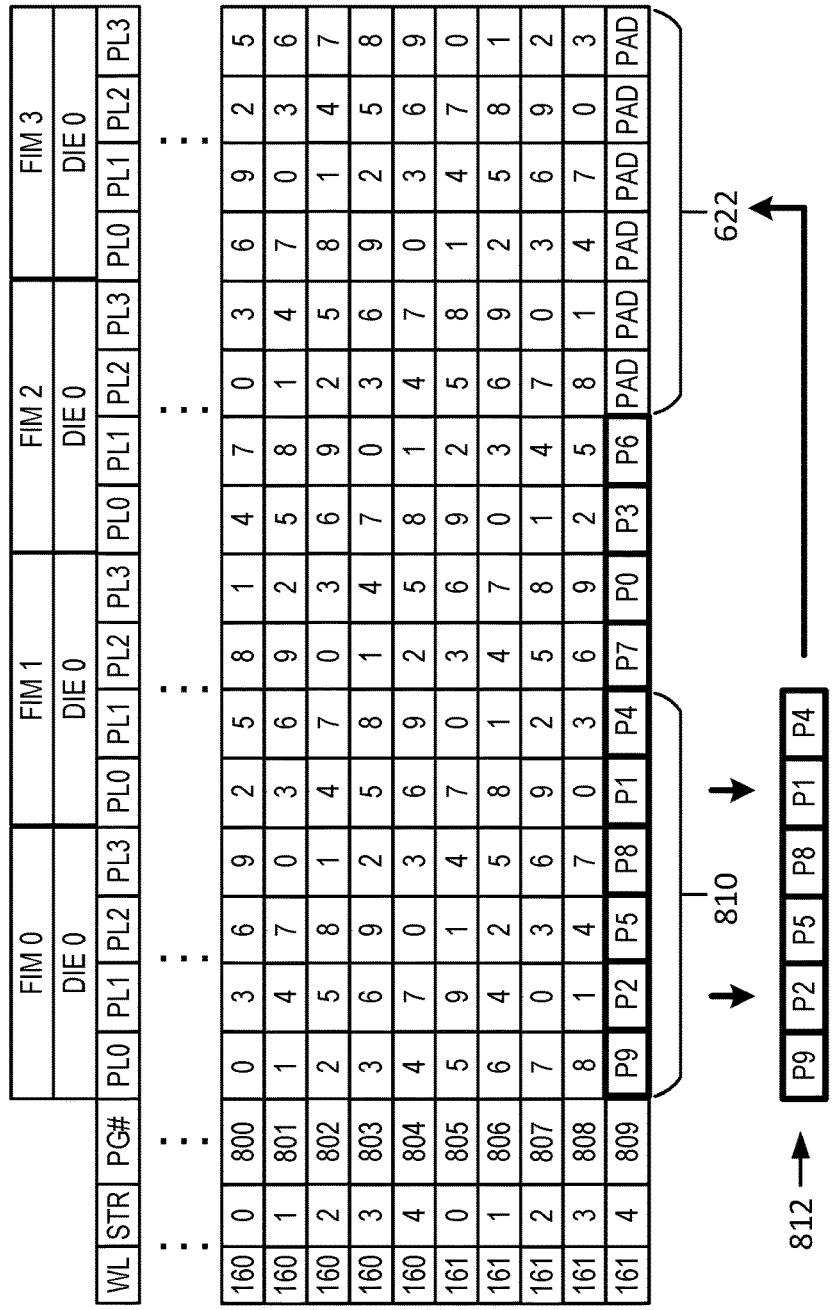
Figure 8B:
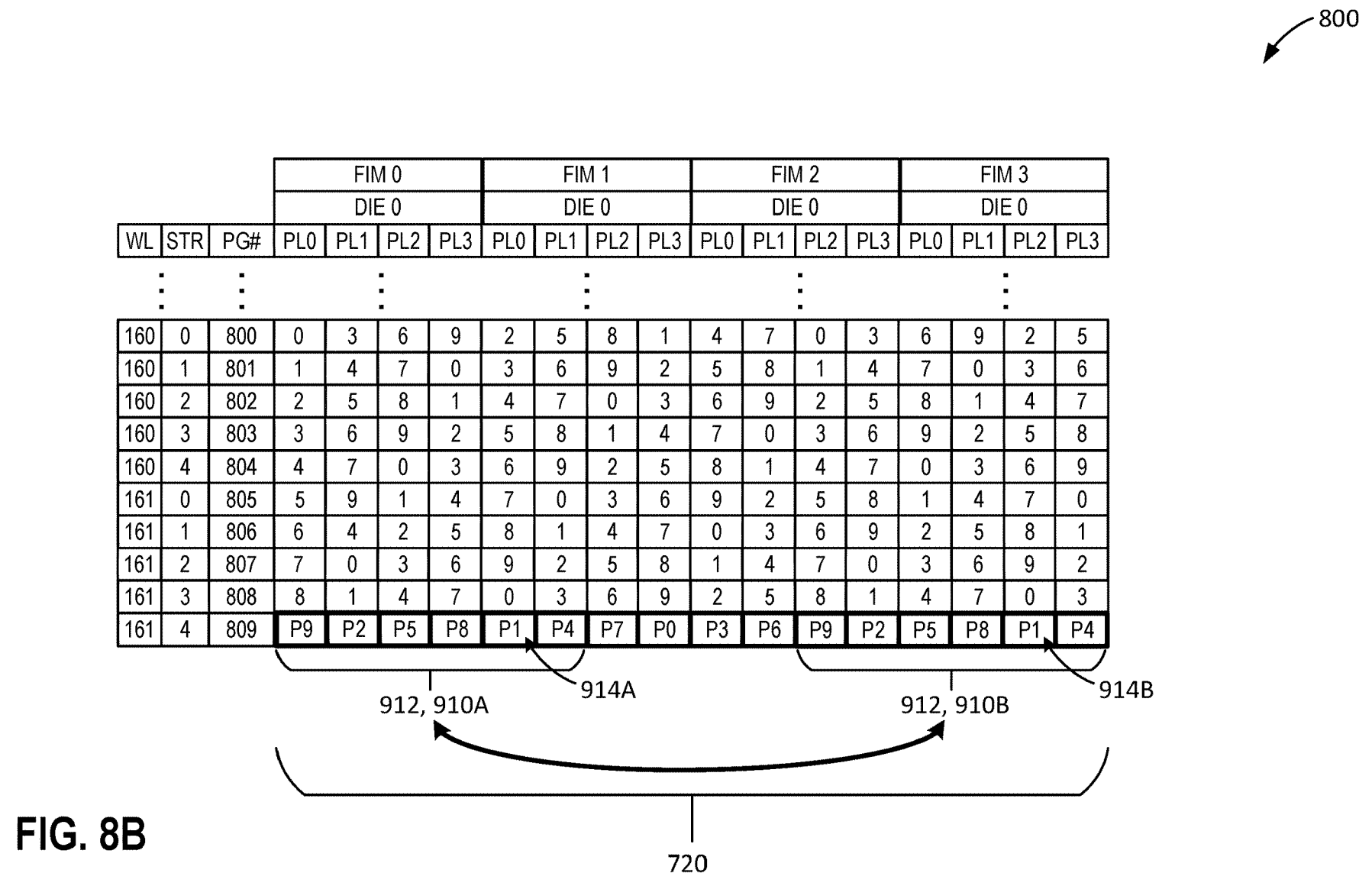

FIGS. 6-8B illustrate stages of reconfiguration during dynamic parity operations for memory similar to that shown in FIGS. 1-3, and using parity table structure and nomenclature similar to that shown and described in relation to FIGS. 4 and 5. More specifically, FIG. 6 provides a parity table 600 of an example memory structure that illustrates an example initial parity bin and parity placement configuration, where FIGS. 7A-7C illustrate stages of reconfiguration during a dynamic change to the parity configuration that relocates some parity cells, and where FIGS. 8A and 8B illustrate stages of reconfiguration during a dynamic change to the parity configuration that replicates some parity cells.

Referring now to FIG. 6, the parity table 600 includes multiple transfer channels (e.g., FIM 0, FIM 1, FIM 2, and FIM 3), each of which has a single memory die (e.g., DIE 0), and each memory die has four planes (e.g., PL0, PL1, PL2, and PL3). The rows of the parity table 500 are similarly organized by page numbers (PG #), where each row has a unique page number, starting at zero (e.g., 0 to 809), and where each row represents a particular word line (WL) and string (STR). It should be understood that the number of FIMs 420, memory dies 422 per FIM 422, planes 424 per memory die 422, strings 414 per word line 412, and total number of word lines 412 and pages 416 used in the example embodiments shown herein, including FIGS. 4-8B, are merely representative, may vary based on different memory architectures.

In this example, and similar to the parity bin configuration shown in FIG. 4, the parity bin configuration of FIGS. 6-8B include ten parity bins, 0 through 9. Further, the parity configuration initially begins with a parity area 620 and a padding area 622. The parity area 620 includes ten parity cells, P0 through P9, and may be similar to the parity areas 440, 510 shown in FIGS. 4 and 5. The padding area 622 includes six padding cells and may be similar to the padding area 512 shown in FIG. 5. While the padding area 622 is assigned to the right-most cells of row 809, it should be understood that the padding area 622 may be assigned to the left-most cells of row 809, thus shifting the parity area 620 to the right-most cells.

In the example initial configuration shown in FIG. 6, it can be seen that the parity data (e.g., parity cells P0-P9) are unevenly distributed to use<FIM 0, DIE 0>, <FIM 1, DIE 0>, and <FIM 2, DIE 0>. This particular distribution of parity data across those particular memory dies 422 may result in a less reliable configuration if, for example, one of those memory dies 422 exhibit a disproportional amount of errors relative to the other memory dies 422. For example, if <FIM 0, DIE 0>exhibits significant errors during operation, then the parity protection provided by the memory controller 122 may be compromised. Such situations can lead to, for example, a reduction in performance (e.g., additional reads, writes, and computations needing to be performed to maintain data integrity), a loss of parity protection potentially leading to data corruption, or the like.

During operation, the memory controller 122 may monitor the memory for particular errors and may use that error data to make dynamic changes to the parity configuration. For example, the memory controller 122 may track a number of read errors on the memory dies 422, a number of bad blocks on the memory dies 422, bad block distribution of the memory (e.g., at time zero after manufacture, prior to use), or the like. This data is collectively referred to herein as "memory error data," or just "error data."

The memory controller 122 uses this error data to trigger dynamic changes to the parity configuration when a portion of the parity area 620 is implicated. For example, the memory controller 122 may initiate a configuration change when a number of read errors (e.g., errors per unit time, total errors since last reset) on one of the parity memory dies exceeds a predetermined threshold, or when a number of bad blocks on one of the parity dies exceeds a predetermined threshold. These conditions for performing changes to the parity configuration may be referred to herein as parity change trigger conditions. The above example parity change trigger conditions are "independent" trigger conditions, as they relate to errors for a particular device component that are not compared to other device components.

In some embodiments, parity change trigger conditions may be "relative" trigger conditions, as they relate to comparing a relative amount of errors between a particular device component and other similar device components (e.g., using a relative threshold value). For example, <FIM 0, DIE 0>, one of the parity dies in this current configuration, may exhibit m read errors (or error rate) and <FIM 3, DIE 0>, a memory die that is not one of the parity dies in this current configuration, may exhibit n read errors (or error rate). A relative parity change trigger condition may include, for example, triggering a dynamic change in the parity configuration when the error value (or error rate) m of any parity die exceeds the error value (or error rate) n of any non-parity memory die by a predetermined threshold (e.g., a fixed error value difference, a fixed error rate difference, a percentage difference, or the like). In other words, the memory controller 122 may trigger a change in parity configuration when there is another memory die that is performing significantly better than a current parity die. Another relative parity change trigger condition may include errors like program or erase errors that result in bad blocks being created. After a particular memory die exceeds a predetermined threshold number of bad blocks, the change in the parity configuration may be triggered.

The memory controller 122 may be configured to collect error data and monitor that error data relative to one or more parity change trigger conditions. Upon occurrence of one of the parity change trigger conditions, the memory controller 122 may be configured to perform one of the dynamic parity reconfiguration methods described herein.

FIGS. 7A-7C show an example parity table 700 illustrating stages of dynamic parity reconfiguration that includes moving one or more parity cells. In the example embodiment, the memory controller 122 begins with an initial parity configuration as shown in parity table 600 of FIG. 6. In this example, presume that <FIM 0, DIE 0>has exhibited errors enough to trigger a dynamic parity reconfiguration, and that <FIM 3, DIE 0>has exhibited relatively few errors. In this example, the memory controller 122 moves some of the parity cells 712 from an evacuated area 710 (e.g., the memory cells originally containing parity cells P9, P2, P5, P8, P1, and P4) to the padding area 622. FIG. 7A illustrates the copying of the parity cells 712 of the evacuated area 710 to the padding area 622, where FIG. 7B illustrates the resultant parity configuration after the parity cells 712 have been moved, showing the resulting location of the parity area 620. After the parity reconfiguration, none of the parity cells of parity area 620 remain on the erroring<FIM 0, DIE 0>, thus resulting in a parity configuration that avoids the error-prone regions. While the examples shown here exhibit a movement of a six-cell group (e.g., the evacuated area 710, and based on the size of the padding area 622), it should be understood that other sized sets of one or more cells may be targeted for relocation (e.g., four-cell grouping by dye, based on the number of cells in a die-row). In some embodiments, selecting a relocation group size based on the size of the padding area may improve performance or otherwise avoid introducing larger complexities and reducing performance.

In the example shown in FIG. 7B, the evacuated region 710 is reconfigured as the padding area 622 (e.g., where the PAD cells contain neither user data nor parity data).

In other embodiments, the evacuated region 710 may be reconfigured to contain user data. FIG. 7C illustrates the parity configuration after the cells of the evacuated region 710 have been reconfigured to contain user data. In this example, the cells of the evacuated region 710 have been assigned to parity bins 9, 2, 4, 7, 0, and 3, respectively, from left to right (e.g., following the parity bin assignment pattern of each of the particular FIM/DIE/PL columns, and subsequent to the above cells of page 808). Further, it should be noted that the padding area 620 has also been removed. As such, the resulting parity configuration establishes more store space available for user data, thus increasing the amount of total memory available for user data as compared to the original parity configuration shown in FIG. 6.

FIGS. 8A and 8B show an example parity table 800 illustrating stages of reconfiguration during dynamic parity reconfiguration that includes duplicating one or more parity cells. In the example embodiment, the memory controller 122 begins with an initial parity configuration as shown in parity table 600 of FIG. 6. In this example, presume that <FIM 0, DIE has exhibited errors enough to trigger a dynamic parity reconfiguration. In this example, the memory controller 122 creates a duplicate copy of some of the parity cells 812 from a replicated area 810 (e.g., the memory cells containing parity cells P9, P2, P5, P8, P1, and P4). More specifically, the parity cells 812 are copied to the cells of the padding area 622. FIG. 8A illustrates the copying of the parity cells 712 of the replicated area 710 to the padding area 622, where FIG. 8B illustrates the resultant parity configuration after the parity cells 812 have been replicated, showing the resulting expanded parity area 620. After the parity reconfiguration, the parity cells 812 appear in both of replicated regions 810A and 810B. In other words, parity cells P9, P2, P5, P8, P1, and P4 each appear twice in the parity area 620, once in the original replicated region 810A, and again in the replicated region 810B (e.g., the original padding area 622), and are maintained as mirrored cells (e.g., any changes to one of the mirrored cells causes the same changes to the other of the mirrored cells).

The resulting parity configuration shown in FIG. 8B results in duplicate copies of parity cells P9, P2, P5, P8, P1, and P4 (collectively, the "replicated parity cells"). More specifically, these parity cells are replicated, and that replication is maintained after the reconfiguration. Replication of parity cells includes changing both copies of each associated replicated cell whenever the underlying parity data for that cell changes. For example, parity cell P1 includes a first replicated cell 814A and a second replicated cell 814B. Whenever parity data for parity bin 1 changes, both of the replicated cells 814A and 814B are updated with the new parity data. Whenever parity data is read (e.g., for a de-XOR rebuilding operation to reconstruct lost data), either of the replicated cells 814A, 814B may be used for the parity bin 1 parity data. Replication of parity cells provides greater redundancy in parity data, leading to better reliability in the ability of the memory controller 122 to properly recover from memory errors.

In some embodiments, the memory controller 122 may delay or otherwise select a particular time for performing parity reconfigurations such as those described in FIGS. 6-8B. It may be beneficial to select a time for parity reconfiguration, such as when the memory as a whole, or the portions of memory implicated by the change, are relatively idle (e.g., lower read or write rates). For example, the memory controller 122 may detect the occurrence of a parity reconfiguration trigger condition and may identify a timing for when to perform that parity reconfiguration operation. The memory controller 122 may, for example, queue the reconfiguration operation and monitor aspects of current performance (e.g., I/O usage load on the memory). When the current performance of the memory falls below a predetermined threshold, the memory controller 122 performs the queued parity reconfiguration.

Figure 9A:
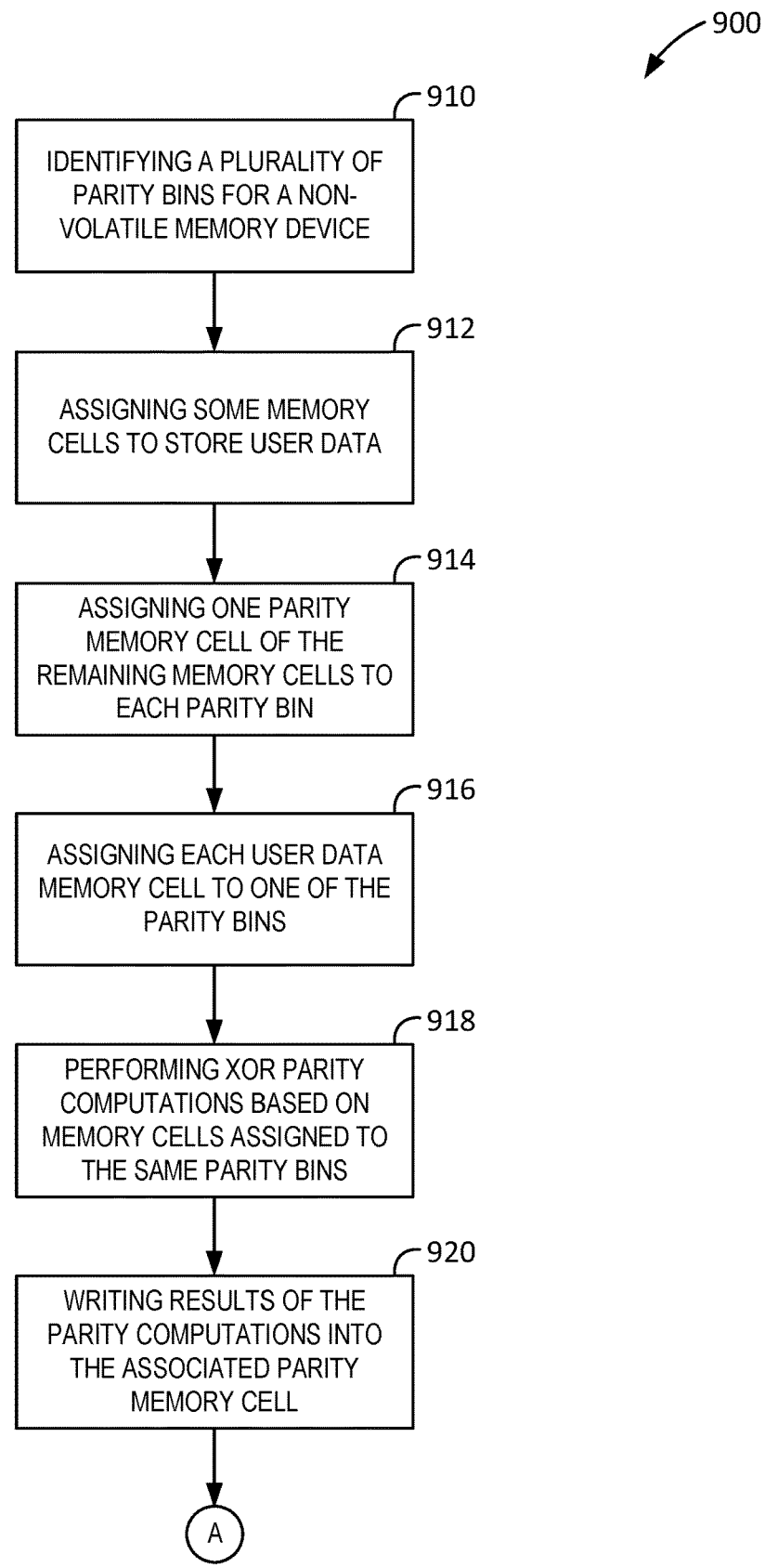
FIGS. 9A-9B are a flow chart illustrating a method for providing dynamic parity protection functionality to a memory device such as the 3D memory structure shown in FIGS. 1-3.
Figure 9B:
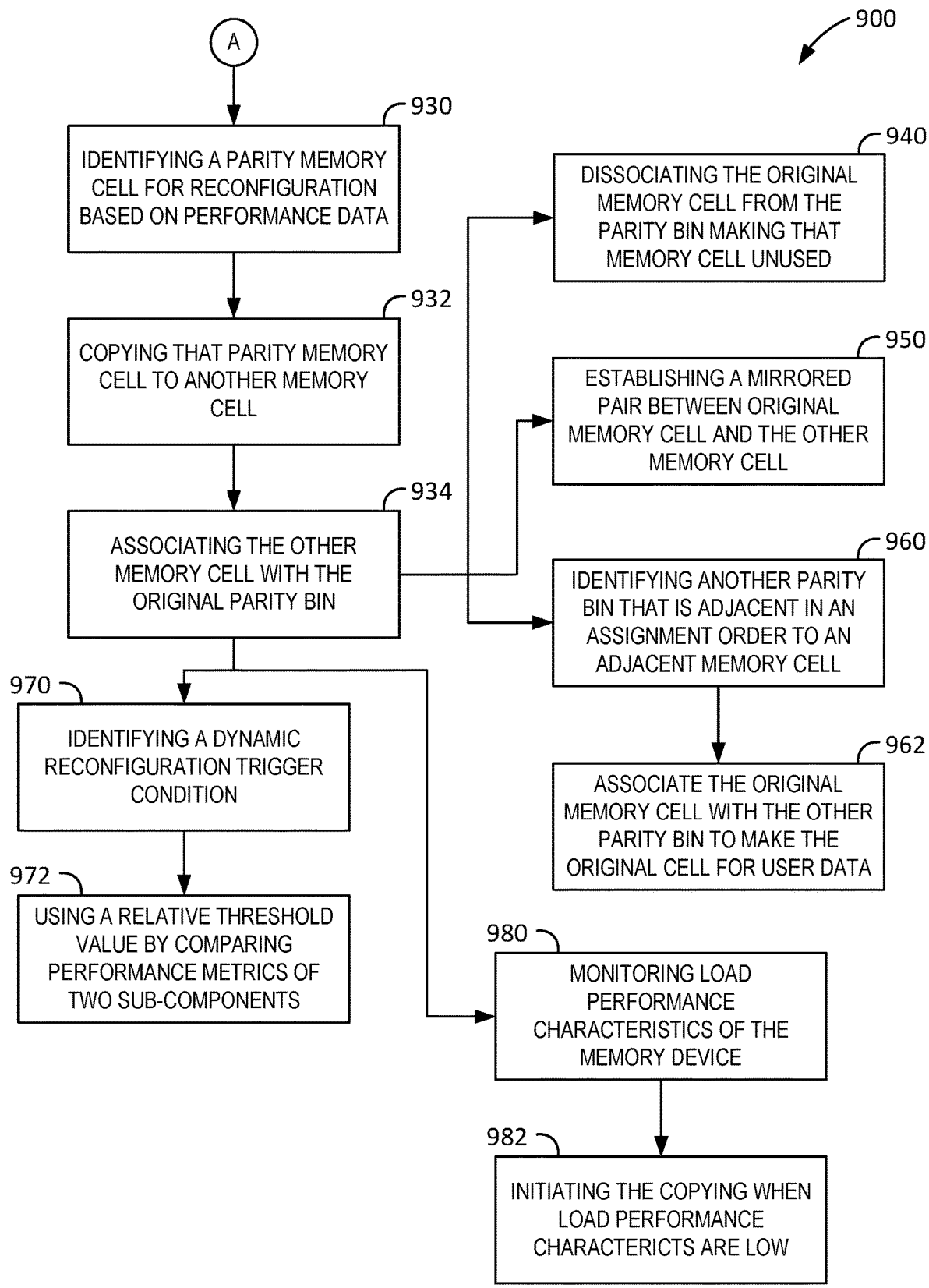

FIGS. 9A-9B are a flow chart illustrating a method 900 for providing dynamic parity protection functionality to a memory device such as the 3D memory structure 126 shown in FIGS. 1-3. In some embodiments, the method 900 is performed by the memory controller 122 shown in FIGS. 2 and 3, and the various components thereof. In the example embodiment, the method 900 begins when the memory controller 122 identifies (910) a plurality of parity bins associated with a non-volatile memory device, where the non-volatile memory device includes a plurality of memory cells. The plurality of parity bins may be similar to those shown in FIGS. 4-8A, and can be of any number (e.g., 0-9, 0-29, or the like). The method includes assigning (912) a first subset of memory cells from the plurality of memory cells to store user data, thereby defining a plurality of user data memory cells and a remainder subset of memory cells. The first subset of memory cells may be, for example, and using the configuration of FIG. 6 as an example, all of the memory cells of the memory area 402, excluding the memory cells of parity area 620 and padding area 622.

In the example embodiment, the method 900 also includes assigning (914) one memory cell from the remainder subset of memory cells to each parity bin of the plurality of parity bins, thereby defining a plurality of parity memory cells configured to store parity data. For example, each of the memory cells of the parity area 620 may be assigned to one of the parity bins 0-9 (e.g., as P0-P9). Referring to FIG. 9A, the method 900 further includes assigning (916) each user data memory cell of the plurality of user data memory cells to one of the parity bins of the plurality of parity bins (e.g., to one of the parity bins 0-9). The method 900 also includes performing (918) exclusive-OR (XOR) parity computations during a write operation to a first user data memory cell that is assigned to a first parity bin, the XOR parity computations generating first parity data based, at least in part, on updated contents of the first user data memory cell and contents of each user data memory cell also assigned to the first parity bin, the XOR parity computations including storing (920) the first parity data into a first parity memory cell associated with the first parity bin. Upon completion of the storing (920), in the example embodiment, XOR parity protection is established for the user data memory cells.

In the example embodiment, and referring now to FIG. 9B, the method 900 includes identifying (930) a second parity memory cell for dynamic reconfiguration based, at least in part, on performance data of the non-volatile memory device, the second parity memory cell being assigned to a second parity bin. For example, the second parity memory cell(s) may include the parity memory cell 914A and the other parity memory cells of replicated region 810 or replicated area 710 (shown in FIGS. 7A-8B). The method 900 also includes copying (932) the second parity memory cell to a third memory cell of the plurality of memory cells (e.g., copying the parity memory cells of replicated area 710 to the padding area 622). The method further includes associating (934) the third memory cell with the second parity bin, thereby making the third memory cell a parity memory cell of the plurality of parity memory cells. For example, the memory cells of the padding area 622 may be associated with the parity bins 9, 2, 5, 8, 1, and 4, respectively.

In some embodiments, the method 900 may include dissociating (940) the second memory cell from the second parity bin, thereby making the second memory cell unused (e.g., as shown and described in FIG. 7B). In other embodiments, the method 900 may include establishing (950) a mirrored pair between the second parity memory cell to the third memory cell that causes any changes to one of the mirrored pair to the other of the mirrored pair (e.g., as shown and described in FIG. 8B). In still other embodiments, the method 900 may include identifying (960) a fourth parity bin that is adjacent in an assignment order to a fourth memory cell that is physically adjacent to the second memory cell, and associating (962) the second memory cell with the fourth parity bin, thereby making the second memory cell into a user data memory cell of the plurality of user data memory cells (e.g., as shown and described in FIG. 7C).

In some embodiments, the method 900 may include identifying (970) a dynamic reconfiguration trigger condition that defines when a dynamic reconfiguration of parity data is to be performed on the non-volatile memory device, the dynamic reconfiguration trigger condition identifying a first performance metric for the non-volatile memory device and an associated threshold value, and where identifying a second parity memory cell for dynamic reconfiguration includes detecting occurrence of the dynamic reconfiguration trigger condition based, at least in part, on performance data for components of the non-volatile memory device. In some embodiments, the method 900 includes the threshold value of the dynamic reconfiguration trigger condition is a relative threshold value (972), and detecting occurrence of the dynamic reconfiguration trigger condition is based on comparing a difference value between two sub-components of the non-volatile memory device with respect to the first performance metric, the dynamic reconfiguration trigger condition being satisfied when the difference value exceeds the relative threshold value.

In some embodiments, the method 900 includes monitoring (980) one or more load performance characteristics associated with the non-volatile memory device, and initiating (982) the copying when the one or more load performance characteristics are below a predetermined threshold.

The term computer-readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by a computing device. Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method, comprising:
identifying a plurality of parity bins associated with a non-volatile memory device, the non-volatile memory device including a plurality of memory cells;
assigning a first subset of memory cells from the plurality of memory cells to store user data, thereby defining a plurality of user data memory cells and a remainder subset of memory cells;
assigning one memory cell from the remainder subset of memory cells to each parity bin of the plurality of parity bins, thereby defining a plurality of parity memory cells configured to store parity data;
assigning each user data memory cell of the plurality of user data memory cells to one of the parity bins of the plurality of parity bins;
performing exclusive-OR (XOR) parity computations during a write operation to a first user data memory cell that is assigned to a first parity bin, the XOR parity computations generating first parity data based, at least in part, on updated contents of the first user data memory cell and contents of each user data memory cell also assigned to the first parity bin, the XOR parity computations including storing the first parity data into a first parity memory cell associated with the first parity bin;
identifying a second parity memory cell for dynamic reconfiguration based, at least in part, on performance data of the non-volatile memory device, the second parity memory cell being assigned to a second parity bin;
copying the second parity memory cell to a third memory cell of the plurality of memory cells; and
associating the third memory cell with the second parity bin, thereby making the third memory cell a parity memory cell of the plurality of parity memory cells.

2. The method of claim 1, further comprising dissociating the second memory cell from the second parity bin, thereby making the second memory cell unused.

3. The method of claim 1, further comprising establishing a mirrored pair between the second parity memory cell to the third memory cell that causes any changes to one of the mirrored pair to the other of the mirrored pair.

4. The method of claim 1, further comprising:
identifying a fourth parity bin that is adjacent in an assignment order to a fourth memory cell that is physically adjacent to the second memory cell; and
associating the second memory cell with the fourth parity bin, thereby making the second memory cell into a user data memory cell of the plurality of user data memory cells.

5. The method of claim 1, further comprising:
identifying a dynamic reconfiguration trigger condition that defines when a dynamic reconfiguration of parity data is to be performed on the non-volatile memory device, the dynamic reconfiguration trigger condition identifying a first performance metric for the non-volatile memory device and an associated threshold value,
wherein identifying a second parity memory cell for dynamic reconfiguration includes detecting occurrence of the dynamic reconfiguration trigger condition based, at least in part, on performance data for components of the non-volatile memory device.

6. The method of claim 5, wherein the threshold value of the dynamic reconfiguration trigger condition is a relative threshold value, wherein detecting occurrence of the dynamic reconfiguration trigger condition is based on comparing a difference value between two sub-components of the non-volatile memory device with respect to the first performance metric, the dynamic reconfiguration trigger condition being satisfied when the difference value exceeds the relative threshold value.

7. The method of claim 1, further comprising:

monitoring one or more load performance characteristics associated with the non-volatile memory device; and initiating the copying when the one or more load performance characteristics are below a predetermined threshold.

8. A storage device, comprising:

a non-volatile storage device comprising a plurality of memory dies, the non-volatile memory device including a plurality of memory cells; and a controller communicatively coupled to the non-volatile storage device and configured to:

identify a plurality of parity bins associated with a non-volatile memory device;

assign a first subset of memory cells from the plurality of memory cells to store user data, thereby defining a plurality of user data memory cells and a remainder subset of memory cells;

assign one memory cell from the remainder subset of memory cells to each parity bin of the plurality of parity bins, thereby defining a plurality of parity memory cells configured to store parity data;

assign each user data memory cell of the plurality of user data memory cells to one of the parity bins of the plurality of parity bins;

perform exclusive-OR (XOR) parity computations during a write operation to a first user data memory cell that is assigned to a first parity bin, the XOR parity computations generating first parity data based, at least in part, on updated contents of the first user data memory cell and contents of each user data memory cell also assigned to the first parity bin, the XOR parity computations including storing the first parity data into a first parity memory cell associated with the first parity bin;

identify a second parity memory cell for dynamic reconfiguration based, at least in part, on performance data of the non-volatile memory device, the second parity memory cell being assigned to a second parity bin;

copy the second parity memory cell to a third memory cell of the plurality of memory cells; and associate the third memory cell with the second parity bin, thereby making the third memory cell a parity memory cell of the plurality of parity memory cells.

9. The storage device of claim 8, wherein the controller is further configured to dissociate the second memory cell from the second parity bin, thereby making the second memory cell unused.

10. The storage device of claim 8, wherein the controller is further configured to establish a mirrored pair between the second parity memory cell to the third memory cell that causes any changes to one of the mirrored pair to the other of the mirrored pair.

11. The storage device of claim 8, wherein the controller is further configured to:

identify a fourth parity bin that is adjacent in an assignment order to a fourth memory cell that is physically adjacent to the second memory cell; and associate the second memory cell with the fourth parity bin, thereby making the second memory cell into a user data memory cell of the plurality of user data memory cells.

12. The storage device of claim 8, wherein the controller is further configured to:

identify a dynamic reconfiguration trigger condition that defines when a dynamic reconfiguration of parity data is to be performed on the non-volatile memory device, the dynamic reconfiguration trigger condition identifying a first performance metric for the non-volatile memory device and an associated threshold value, wherein identifying a second parity memory cell for dynamic reconfiguration includes detecting occurrence of the dynamic reconfiguration trigger condition based, at least in part, on performance data for components of the non-volatile memory device.

13. The storage device of claim 12, wherein the threshold value of the dynamic reconfiguration trigger condition is a relative threshold value, wherein detecting occurrence of the dynamic reconfiguration trigger condition is based on comparing a difference value between two sub-components of the non-volatile memory device with respect to the first performance metric, the dynamic reconfiguration trigger condition being satisfied when the difference value exceeds the relative threshold value.

14. The storage device of claim 8, wherein the controller is further configured to:

monitor one or more load performance characteristics associated with the non-volatile memory device; and initiate the copying when the one or more load performance characteristics are below a predetermined threshold.

15. A storage device, comprising:

a non-volatile storage device comprising a plurality of memory dies, the non-volatile memory device including a plurality of memory cells; and means for performing exclusive-OR (XOR) parity computations on the non-volatile memory device between a plurality of user data memory cells and a plurality of parity memory cells based, at least in part, on assignment of one parity bin of a plurality of parity bins to each memory cell of the plurality of user data memory cells and the plurality of parity memory cells;

means for identifying a first parity memory cell for dynamic reconfiguration based, at least in part, on performance data of the non-volatile memory device, the first parity memory cell being assigned to a first parity bin;

means for copying the first parity memory cell to a second memory cell of the plurality of memory cells; and means for associating the second memory cell with the first parity bin, thereby making the second memory cell a parity memory cell of the plurality of parity memory cells.

16. The storage device of claim 15, further comprising means for dissociating the first memory cell from the first parity bin, thereby making the first memory cell unused.

17. The storage device of claim 15, means for establishing a mirrored pair between the first parity memory cell to the second memory cell that causes any changes to one of the mirrored pair to the other of the mirrored pair.

18. The storage device of claim 15, further comprising:
means for identifying a second parity bin that is adjacent in an assignment order to a third memory cell that is physically adjacent to the first memory cell; and
means for associating the first memory cell with the second parity bin, thereby making the first memory cell into a user data memory cell of the plurality of user data memory cells.

19. The storage device of claim 15, further comprising:
means for identifying a dynamic reconfiguration trigger condition that defines when a dynamic reconfiguration of parity data is to be performed on the non-volatile memory device, the dynamic reconfiguration trigger condition identifying a first performance metric for the non-volatile memory device and an associated threshold value,
wherein identifying a second parity memory cell for dynamic reconfiguration includes detecting occurrence of the dynamic reconfiguration trigger condition based, at least in part, on performance data for components of the non-volatile memory device.

20. The storage device of claim 19, wherein the threshold value of the dynamic reconfiguration trigger condition is a relative threshold value, wherein detecting occurrence of the dynamic reconfiguration trigger condition is based on comparing a difference value between two sub-components of the non-volatile memory device with respect to the first performance metric, the dynamic reconfiguration trigger condition being satisfied when the difference value exceeds the relative threshold value.

* * * * *